(12) United States Patent
Gasner et al.

(10) Patent No.: US 7,224,074 B2
(45) Date of Patent: May 29, 2007

(54) ACTIVE AREA BONDING COMPATIBLE HIGH CURRENT STRUCTURES

(75) Inventors: John T Gasner, Satellite Beach, FL (US); Michael D Church, Sebastian, FL (US); Sameer D Parab, Fremont, CA (US); Paul E Bakeman, Jr., Shelburne, VT (US); David A Decrosta, Melbourne, FL (US); Robert Lomenic, Palm Bay, FL (US); Chris A McCarty, Melbourne, FL (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

(21) Appl. No.: 11/305,987

(22) Filed: Dec. 19, 2005

(65) Prior Publication Data

US 2006/0099823 A1 May 11, 2006

Related U.S. Application Data

(62) Division of application No. 10/698,184, filed on Oct. 31, 2003, now Pat. No. 7,005,369.

(60) Provisional application No. 60/507,539, filed on Sep. 30, 2003, provisional application No. 60/496,881, filed on Aug. 21, 2003.

(51) Int. Cl.
*H01L 23/48* (2006.01)
*H01L 21/44* (2006.01)

(52) U.S. Cl. .................... 257/779; 257/780; 257/786; 438/612; 438/614

(58) Field of Classification Search ............... 438/612, 438/614, 622, 624; 257/779, 780, 784, 786
See application file for complete search history.

(56) References Cited

U.S. PATENT DOCUMENTS

| 4,695,868 | A | 9/1987 | Fisher |
|---|---|---|---|
| 6,100,589 | A | 8/2000 | Tanaka |
| 6,133,054 | A | 10/2000 | Henson |
| 6,198,170 | B1 | 3/2001 | Zhao |
| 2001/0000928 | A1 | 5/2001 | Lee et al. |
| 2002/0011674 | A1 | 1/2002 | Efland et al. |
| 2002/0179991 | A1 | 12/2002 | Vamol et al. |
| 2003/0045066 | A1 | 3/2003 | Imal et al. |

OTHER PUBLICATIONS

W. R. Anderson et al, "ESD Protection Under Wire Bonding Pads", EOS/ESD Symposium, 1999, pp. 2A4.1-2A4.7.
W. R. Anderson et al., "Reliability considerations for ESD protection under wire bonding pads", Microelectronics Reliability 41 (2001) pp. 367-373.
T. B. Ching et al., "Bond Pad Structure Reliability", Texas Instruments Incorporated, 1998 IEEE, pp. 64-70.

*Primary Examiner*—Hsien-Ming Lee
(74) *Attorney, Agent, or Firm*—Scott V. Lundberg; Fogg & Powers LLC

(57) ABSTRACT

An integrated circuit with circuits under a bond pad. In one embodiment, the integrated circuit comprises a substrate, a top conductive layer, one or more intermediate conductive layers, layers of insulating material and devices. The top conductive layer has a at least one bonding pad and a sub-layer of relatively stiff material. The one or more intermediate conductive layers are formed between the top conductive layer and the substrate. The layers of insulating material separate the conductive layers. Moreover, one layer of the layers of insulating material is relatively hard and is located between the top conductive layer and an intermediate conductive layer closest to the top conductive layer. The devices are formed in the integrated circuit. In addition, at least the intermediate conductive layer closest to the top conductive layer is adapted for functional interconnections of select devices under the bond pad.

57 Claims, 9 Drawing Sheets

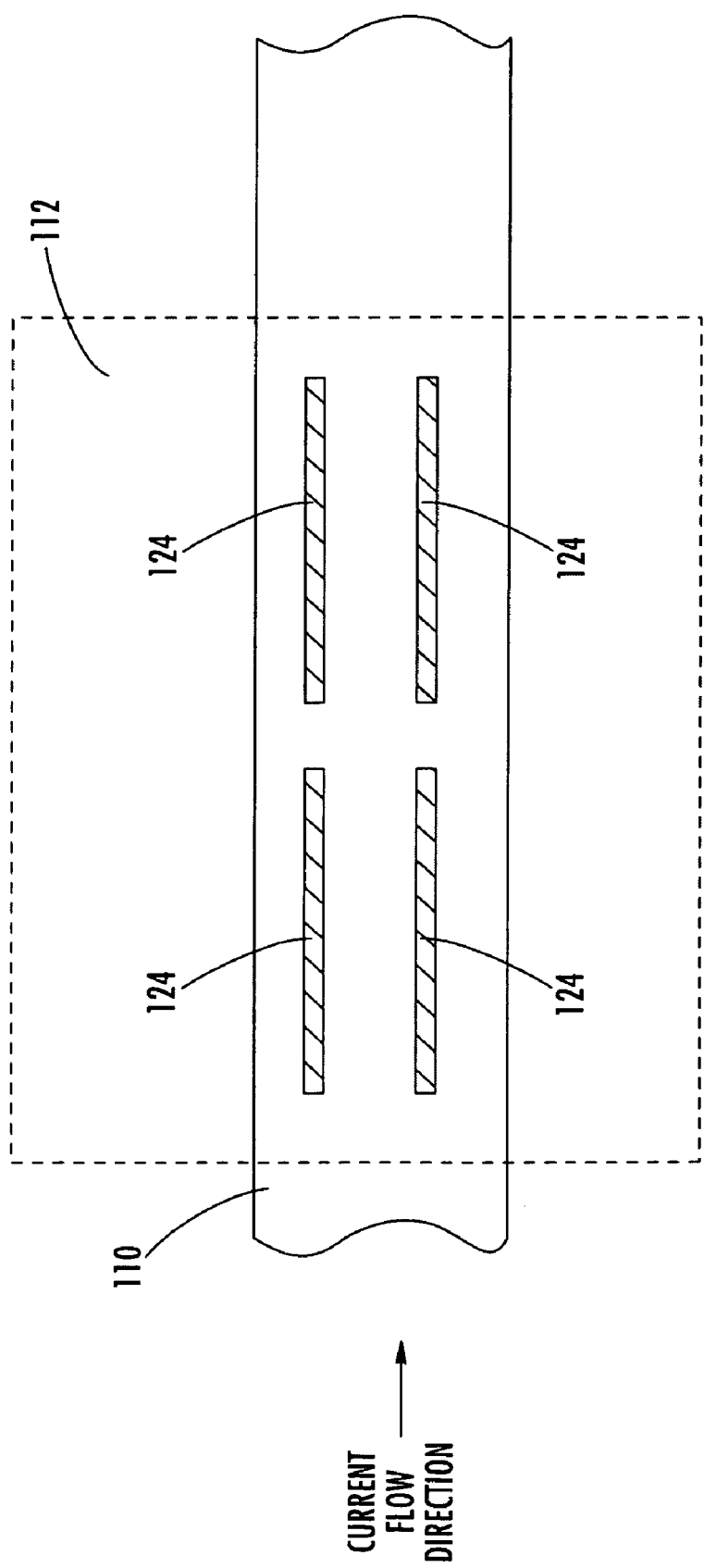

ACTIVE AREA BONDING COMPATIBLE HIGH CURRENT STRUCTURES

This application is a divisional of prior patent application Ser. No. 10/698,184, filed Oct. 31, 2003 now U.S. Pat No. 7,005,369, which claims the benefit under 35 U.S.C. §119(e) of U.S. Provisional Application Ser. No. 60/496,881, filed Aug. 21, 2003, and U.S. Provisional Application Ser. No. 60/507,539, filed Sep. 30, 2003, all of which are incorporated herein by reference in their entirety.

TECHNICAL FIELD

The present invention relates generally to the formation of semiconductor devices and in particular a formation of active circuits under a bond pad.

BACKGROUND

Integrated circuits comprise two or more electronic devices formed in and/or on a substrate of semi-conductive material. Typically, the integrated circuits include two or more metal layers that are used in forming select devices and interconnects between said devices. The metal layers also provide electrical paths to input and output connections of the integrated circuit. Connections to the inputs and outputs of the integrated circuit are made through bond pads. Bond pads are formed on a top metal layer of the integrated circuit. A bonding process (i.e. the bonding of a ball bond wire to the bond pad) can damage any active circuitry formed under the metal layer upon which the bonding pad is formed. Therefore, present circuit layout rules either do not allow any circuitry to be formed under the bonding pad or only allow limited structures that have to be carefully tested.

Damage under bonding pads can be caused by many reasons but mainly it is due to the stresses which have occurred during bond wire attachment process and the subsequent stresses after packaging. For example, temperature excursions after packaging exert both lateral and vertical forces on the overall structure. The metal layers of integrated circuit are typically made of soft aluminum that are separated from each other by harder oxide layers. The soft aluminum tends to give under the forces while the harder oxide layers do not. This eventually leads to cracks in the oxide layers. Once an oxide layer cracks, moisture can enter causing corrosion of the aluminum layers and eventually failure of the circuit function. Therefore, the bonding process typically requires the real estate below the bond pad serve only as a buffer against damage that occurs during the bonding process. However, as chip designers try and reduce the size of chips it would be desired to able to use the real estate under the bonding pad for active circuits or interconnects.

For the reasons stated above and for other reasons stated below which will become apparent to those skilled in the art upon reading and understanding the present specification, there is a need in the art for an improved integrated circuit that effectively allows for use of the real estate under bonding pads for active circuits and interconnects.

SUMMARY

The above-mentioned problems and other problems are resolved by the present invention and will be understood by reading and studying the following specification.

In one embodiment, an integrated circuit is disclosed. The integrated circuit comprises a substrate, a top conductive layer, one or more intermediate conductive layers, layers of insulating material and devices. The top conductive layer has a at least one bonding pad and a sub-layer of relatively stiff material. The one or more intermediate conductive layers are formed between the top conductive layer and the substrate. The layers of insulating material separate the conductive layers. Moreover, one layer of the layers of insulating material is relatively hard and is located between the top conductive layer and an intermediate conductive layer closest to the top conductive layer. The devices are formed in the integrated circuit. In addition, at least the intermediate conductive layer closest to the top conductive layer is adapted for functional interconnections of select devices under the bond pad.

In another embodiment, an integrated circuit is disclosed. The integrated circuit comprises a substrate, device regions, a top metal layer, a second metal layer and a layer of relatively thick insulating material. The device regions are formed on and in the substrate. The top metal layer has one or more bonding pads formed thereon. The device regions are located between the substrate and the top metal layer. The second metal layer is located between the top metal layer and the device regions. The layer of relatively thick insulating material separates the top metal layer from the second metal layer. The relatively thick insulating layer is adapted to resist cracking.

In further another embodiment, another integrated circuit is disclosed. The integrated circuit includes a substrate, a plurality of devices, a second metal layer and a first layer of insulating material. The plurality of devices are formed on and in the substrate. The top metal layer has at least one bond pad formed on a surface of the top metal layer. A second metal layer is located between the top metal layer and the substrate. Moreover, the second metal layer has gaps that are adapted to strengthen the integrated circuit. The first layer of insulating material is formed between the top metal layer and the second metal layer.

In another embodiment, a method of forming an integrated circuit with active circuitry under a bond pad is disclosed. The method comprises forming devices in and on a substrate. Forming a first metal layer. Forming a first layer of relatively thick insulating material overlaying the first metal layer, wherein the thickness of the insulating material strengthens the integrated circuit. Forming a top metal layer overlaying the relatively thick insulating material and forming a bond pad on a surface of the top layer.

In yet another embodiment, a method of forming an integrated circuit is disclosed. The method comprises forming device regions is a substrate. Depositing a first metal layer overlaying the device regions. Pattering the first metal layer to form gaps, wherein the gaps extend in a current flow direction. Forming an insulating layer overlaying the first metal layer and filling in the gaps, wherein the gaps strengthen the integrated circuit by providing pillars of harder insulating material. Depositing a top layer of metal overlaying the oxide layer and forming a bond pad on a surface of the top layer of metal.

In still yet another embodiment, a method of forming an integrated circuit is disclosed. The method comprises forming device regions in and on a substrate. Forming a first metal layer overlaying the device regions. Forming an insulating layer overlaying the first metal region. Forming a top metal layer overlaying the insulating layer including a sub-layer of relatively stiff material near the oxide layer and forming a bonding pad on a surface of the top metal layer.

BRIEF DESCRIPTION OF THE DRAWINGS

The present invention can be more easily understood and further advantages and uses thereof more readily apparent, when considered in view of the description of the preferred embodiments and the following figures in which:

FIG. 2 is a top view of a portion of a metal layer with gaps of one embodiment of the present invention.

In accordance with common practice, the various described features are not drawn to scale but are drawn to emphasize specific features relevant to the present invention. Reference characters denote like elements throughout Figures and text.

DETAILED DESCRIPTION

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims and equivalents thereof.

In the following description, the term substrate is used to refer generally to any structure on which integrated circuits are formed, and also to such structures during various stages of integrated circuit fabrication. This term includes doped and undoped semiconductors, epitaxial layers of a semiconductor on a supporting semiconductor or insulating material, combinations of such layers, as well as other such structures that are known in the art. Terms of relative position as used in this application are defined based on a plane parallel to the conventional plane or working surface of a wafer or substrate, regardless of the orientation of the wafer or substrate. The term "horizontal plane" or "lateral plane" as used in this application is defined as a plane parallel to the conventional plane or working surface of a wafer or substrate, regardless of the orientation of the wafer or substrate. The term "vertical" refers to a direction perpendicular to the horizontal. Terms, such as "on", "side" (as in "sidewall"), "higher", "lower", "over," "top" and "under" are defined with respect to the conventional plane or working surface being on the top surface of the wafer or substrate, regardless of the orientation of the wafer or substrate.

Embodiments of the present invention provide a method and structure of an integrate circuit that allows the use of real estate under bonding pads for active devices and interconnects. Moreover, embodiments of the present invention provide a structure that can use all the metal layers below the bond pad for functional interconnections of the device. In addition, embodiments of the present invention also provide a structure that allows submicron interconnects lines with a TiN top layer and relatively wide lines capable of carrying high currents to exist simultaneously under a bond pad.

Figure 1:
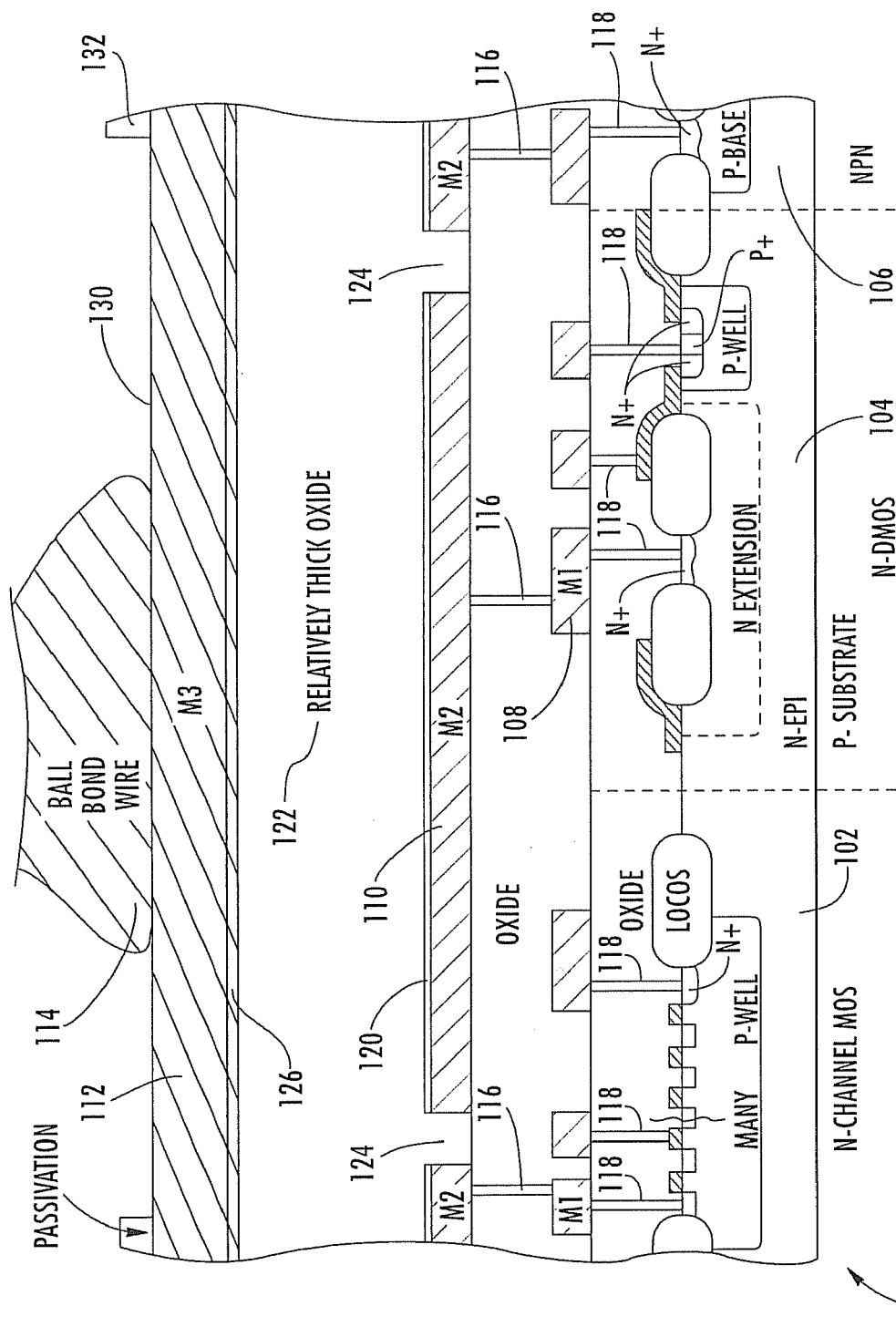
FIG. 1 is a partial cross-sectional view of an integrated circuit of one embodiment of the present invention.

FIG. 1, illustrates a partial cross-section view of an integrated circuit 100 of one embodiment of the present invention. In this embodiment, the part of the integrated circuit 100 shown includes a N-channel MOS power device 102, a N-DMOS device 104 and a NPN bipolar device 106. As FIG. 1 also illustrates three conductive layers, which in this embodiment includes a first metal layer M1 108, a second metal layer M2 110 and a third metal layer M3 112. The metal layers 108, 110 112 can be made of conductive material such as aluminum, copper and the like. Moreover, in another embodiment, at least one of the metal layers 108, 110 and is made by a sub-micron process that forms many sub-layers of alternating conductive layers. The third metal layer M3 112 can be referred to as the top metal layer 112. As illustrated, a bond pad 130 is formed on a surface of the third metal layer M3 112 by patterning a passivation layer 132. A ball bond wire 114 (bond wire 114) can be coupled to the bonding pad 130 to provide an input or output to the integrated circuit 100. Although, this embodiment, only illustrates three metal layers 108, 110 and 112, other embodiments have more or less metal layers. For example, in an embodiment with more than three metal layers, additional metal layers are formed between metal layers 108 and 110. Each interconnect metal layer 108, 110 and 112 is formed by conventional methods known in the art such as depositing and patterning.

As illustrated in FIG. 1, vias 116 selectively couple the interconnect metal layers 110 and 108 to form electrical connections between devices 102, 104 and 106 of the integrated circuit 100. Further shown are vias 118 that provide electrical connections to elements of the devices 102, 104 and 106 and the first metal layer 108.

In one embodiment, the sub-micron process is used to form metal layer M2 110 and metal layer M3 112. The sub-micron process uses many sub-layers to form a metal layer. In one embodiment, the sub-layers are alternating layers of Ti, TiN and Al alloys. Further in one embodiment, the top layer of the sub-layers of metal layer 110 (i.e. the sub-layer facing metal 112) is a TiN layer 120. The TiN layer 120 is used in this location because of its low reflective properties that aid in the patterning of metal layer 110. However, the presence of sub-layer 120 tends to increase the probability that cracks will form in an oxide layer separating the metal layer 110 from metal layer 112. In particular, because the TiN layer tends to be hard it doesn't yield when stress is applied. As a result, lateral stresses on the separating oxide tend to form cracks in the separating oxide layer. Further in another embodiment, a layer of TiW forms sub-layer 120.

Embodiments, of the present invention reduce the probability of the cracks forming in the separating oxide layer 122. In one embodiment, the separating oxide layer 122 (i.e. the oxide layer that separates metal layer 110 from metal layer 112) is formed to be relatively thick. In one embodiment, the separating oxide layer 122 is formed to be at least 1.5 um thick. The use of a separating oxide layer 122 that is relatively thick reduces the probabilities of crack forming in the oxide layer 122. In further another embodiment, the separating oxide layer is generally a dielectric or insulating layer.

Moreover in one embodiment, the third metal layer M3 112 includes a relatively hard sub layer 126 of very stiff and hard material. The hard sub-layer 126 is formed adjacent the separating oxide layer 122 and opposite a side of the third metal layer M3 forming the bond pad 114. The hard sub layer 126 is very stiff and hard compared to aluminum. The hard sub layer distributes lateral and vertical stresses over a larger area of the oxide 122 thereby reducing the propensity of cracking in the oxide 122. In one embodiment, the material used for the hard sub-layer 126 is TiN. This is due to the compatibility of TiN with conventional sub-micron deposition and etch techniques. In yet another embodiment, the hard sub-layer 126 is a layer of nitride. In one embodiment, the hard sub-layer 126 is approximately 80 nm in thickness. In further other embodiments, materials such as TiW are used for the hard sub-layer 126.

In further another embodiment, the second metal layer M2 110 is formed to have gaps 124 in selected areas. Very wide (lateral widths) of the second metal layer 110 tend to weaken the structure thus creating a higher chance that cracks will occur in the separating oxide layer 122. In this embodiment, the gaps 124 tend to strengthen the structure by providing pillars of harder oxide. The impact of the gaps 124 on the function of the integrated circuit is minimized by the proper layout. That is, the density of the gaps may be minimized so that a layout design is not constrained significantly. In one embodiment, the gaps 124 take no more than 10% of the total area of the second metal layer M2 110 under the bond pads. In another embodiment, the gaps are oriented such that the impact on current flow through the second metal layer M2 110 is minimized. An example of gaps 124 formed to minimize the impact on the current flow in the second metal layer M2 is illustrated in FIG. 2. FIG. 2, also illustrates the third metal layer 112.

Figure 3A:
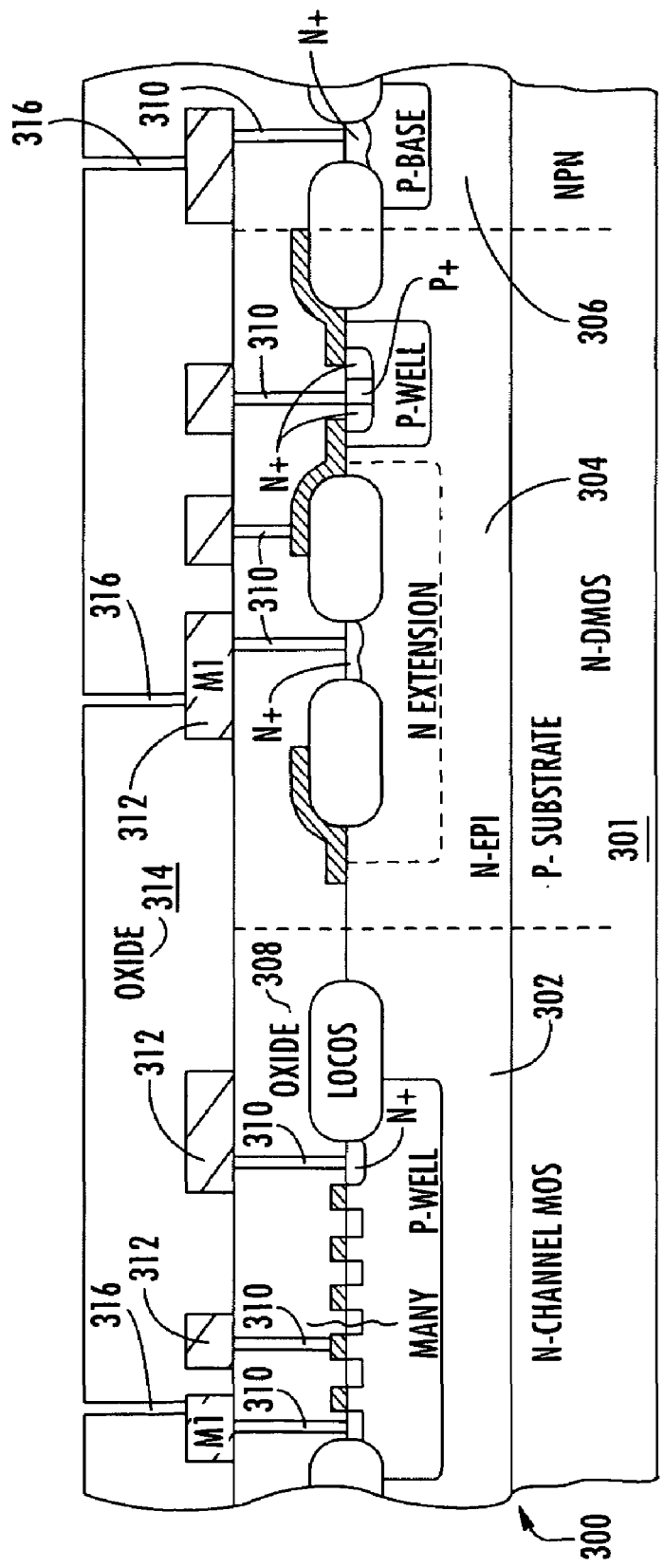
FIGS. 3A through 3G are partial cross-sectional side views of one method of forming an integrated circuit in one embodiment of the present invention.

FIGS. 3A through 3G illustrates the forming of relevant aspects of one embodiment of the present invention. FIG. 3A illustrates a partial cross-sectional side view of the start of the formation of an integrated circuit 300 on a substrate 301. The partial cross-sectional side view illustrates that integrated circuit 300 in this embodiment includes a N-Channel MOS 302, a N-DMOS 304 and a NPN device 306. It will be understood in the art that other types of devices can be formed in the integrated circuit 300 and that the present invention is not limited to only integrated circuits with N-Channel MOS, a N-DMOS and NPN devices. Since the formation of the devices 302, 304 and 306 are not a critical part of the present invention, FIG. 3A illustrates that they are already formed. These devices 302, 304 and 306 are formed by techniques known in the art such as deposition, etching masking and implantation. A first insulating layer 308 is formed overlaying devices 302, 304 and 306. In one embodiment, the insulating layer 308 is a layer of first oxide layer 308. Vias 310 are formed by techniques known in the art such as masking and etching. The vias 310 are then filled with conductive material to form contacts with the first metal layer 312 and elements of the devices 302, 304 and 306. The first metal layer 312 is formed by first depositing a metal layer and then patterning the first metal layer 312 to form select interconnects. A second insulating layer 314 is then formed overlaying the first metal layer M1 312 and exposed areas of the first oxide layer 308. In one embodiment, the second insulting layer 314 is a second oxide layer 314. Vias are formed in the second layer of oxide 314 by masking a surface of the second layer of oxide and etching the vias 316 down to select portions of the patterned first metal layer 312. The vias 316 are then filled with conductive material.

Figure 3B:
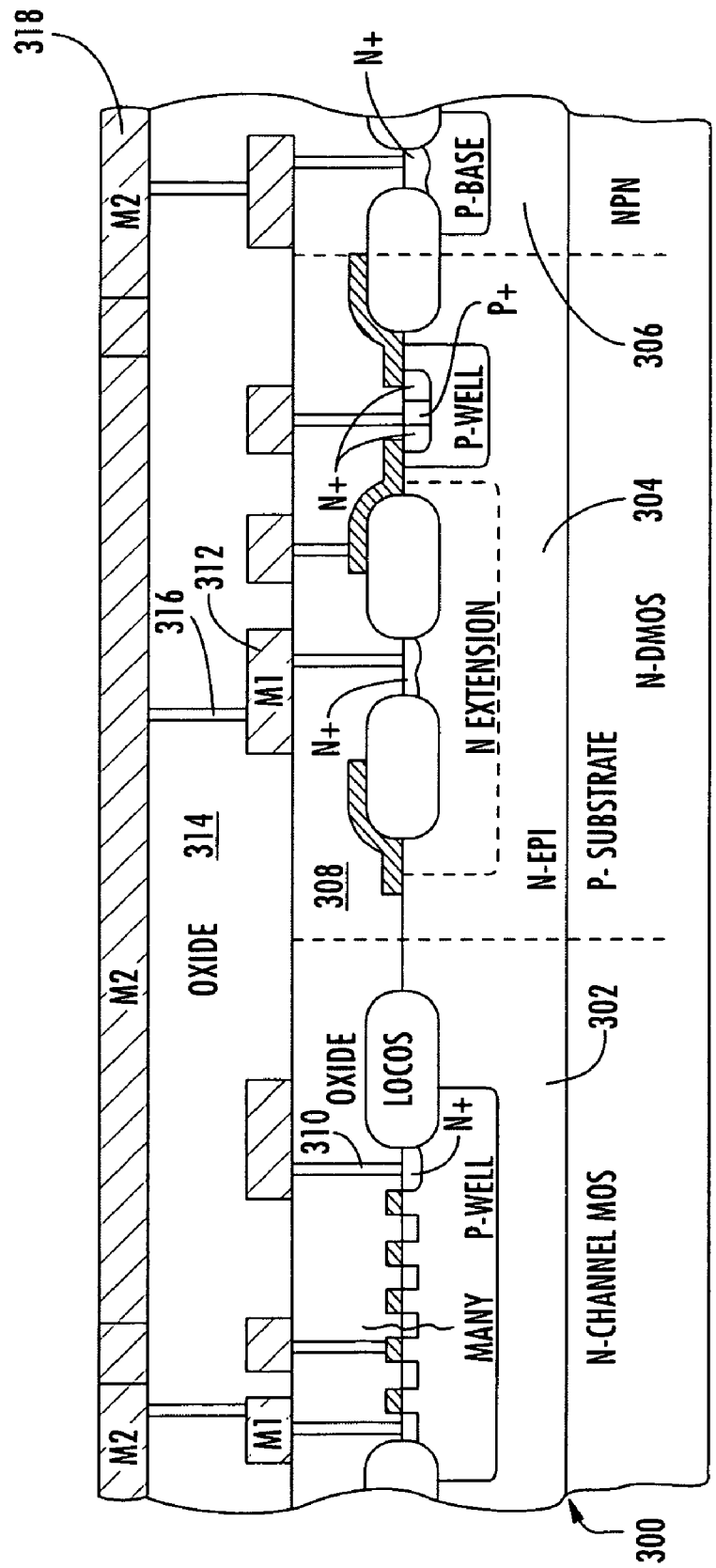
Figure 3C:
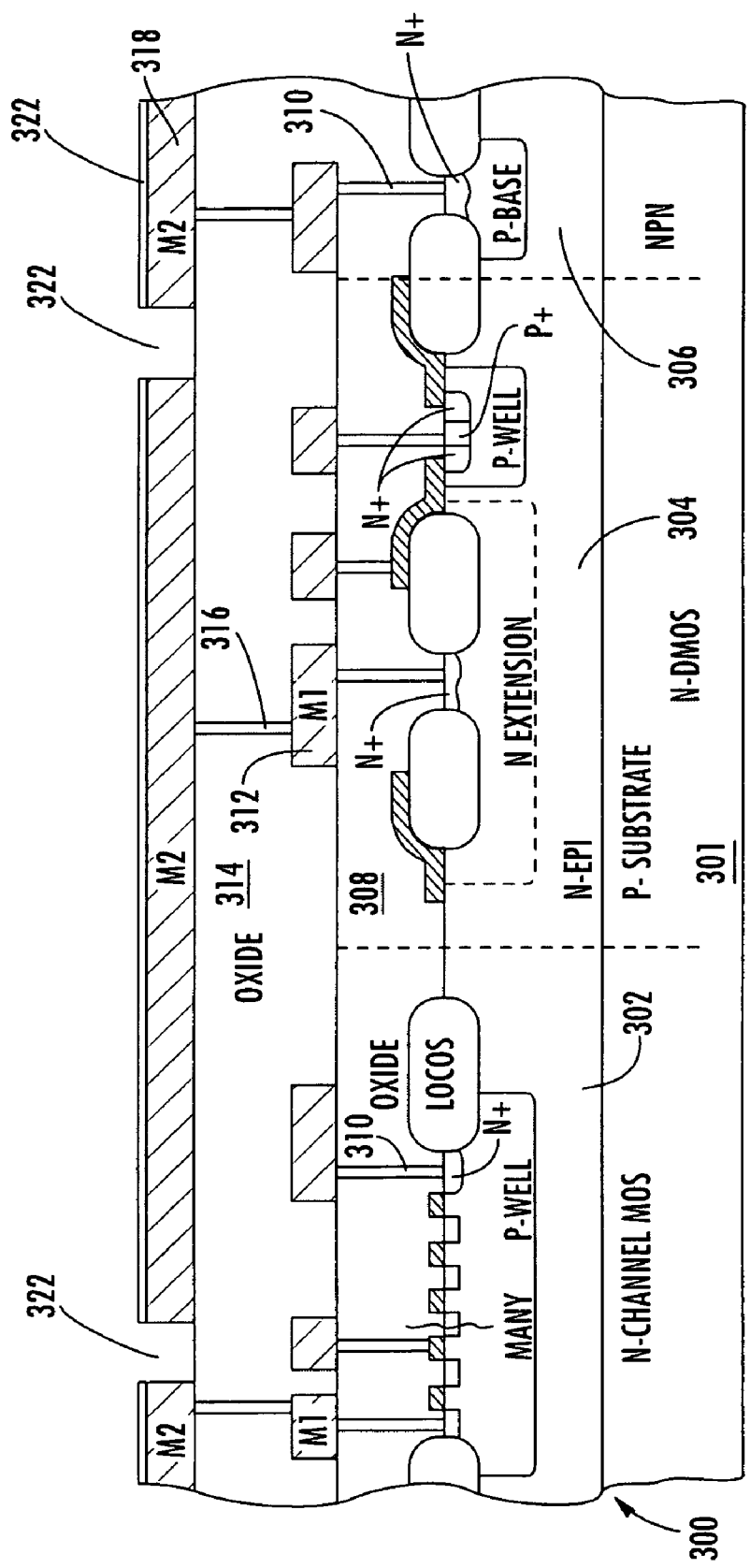
Figure 3D:
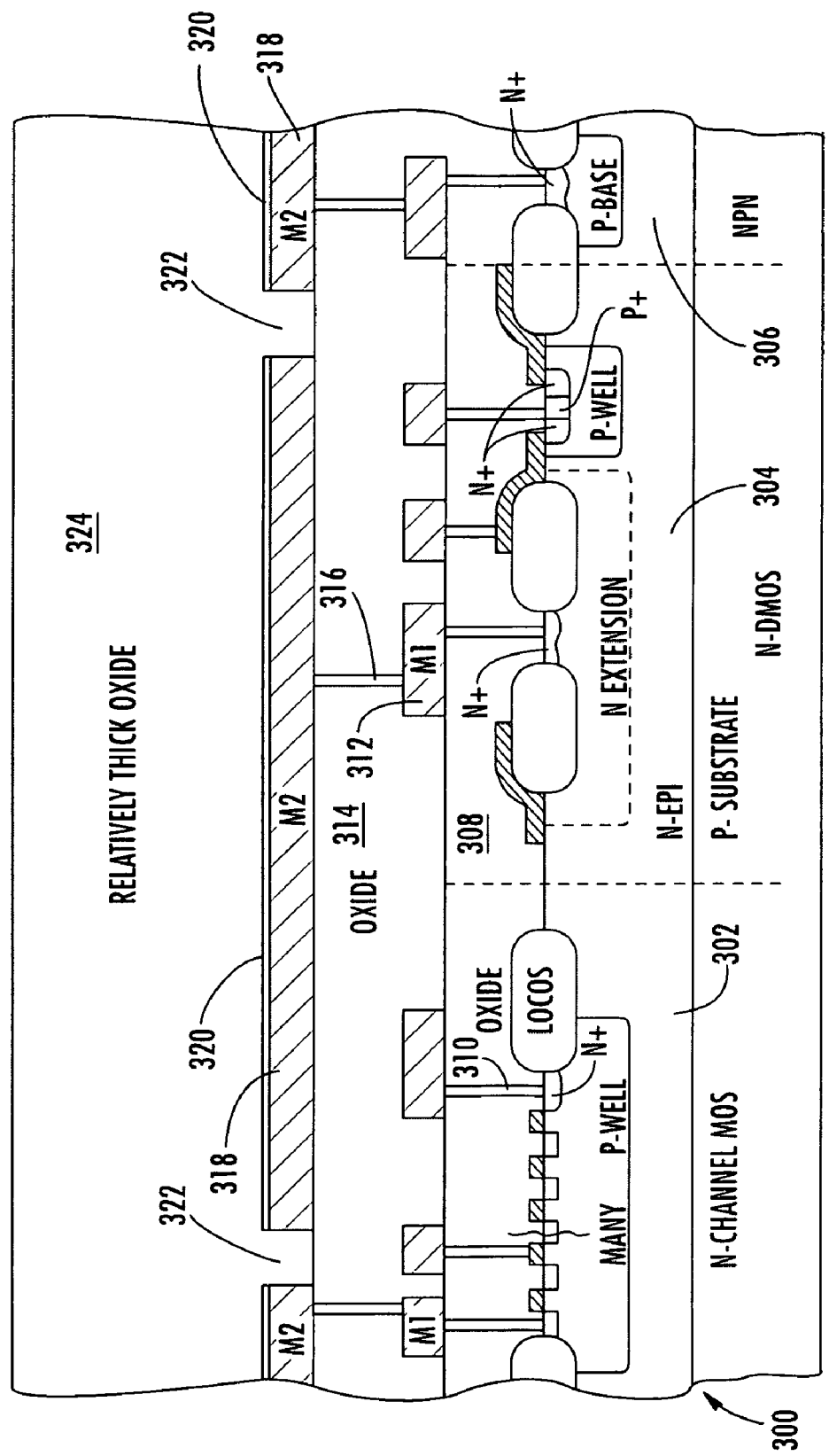

Referring to FIG. 3B, a second metal layer M2 318 is deposited on a surface of the second oxide layer. In one embodiment, the second metal layer 318 is formed by a sub-micron process comprising a plurality of alternating layers of different metals. In one embodiment, the alternating layers of metal are Ti, TiN and Al alloys. A top sub layer 320 of the second metal layer M2 318 is made of TiN which aids in the pattering of the second metal layer M2 318. The top sub layer 320 is illustrated in FIG. 3C. As illustrated in FIG. 3C, in this embodiment, the second metal layer 318 is then patterned to form gaps 322. The gaps 322 strengthen the structure by providing pillars of hard oxide. A third insulating layer 324 is then formed overlaying the second metal layer M2. This is illustrated in FIG. 3D. In one embodiment, the third insulating layer 324 is a third oxide layer 324. The third oxide layer 324 also fills in the gaps 322. In one embodiment, the third oxide layer 324 (separating oxide layer 324) is formed to be relatively thick. Moreover, in one embodiment the thickness of the separating oxide layer 324 is at least 1.5 um.

Figure 3E:
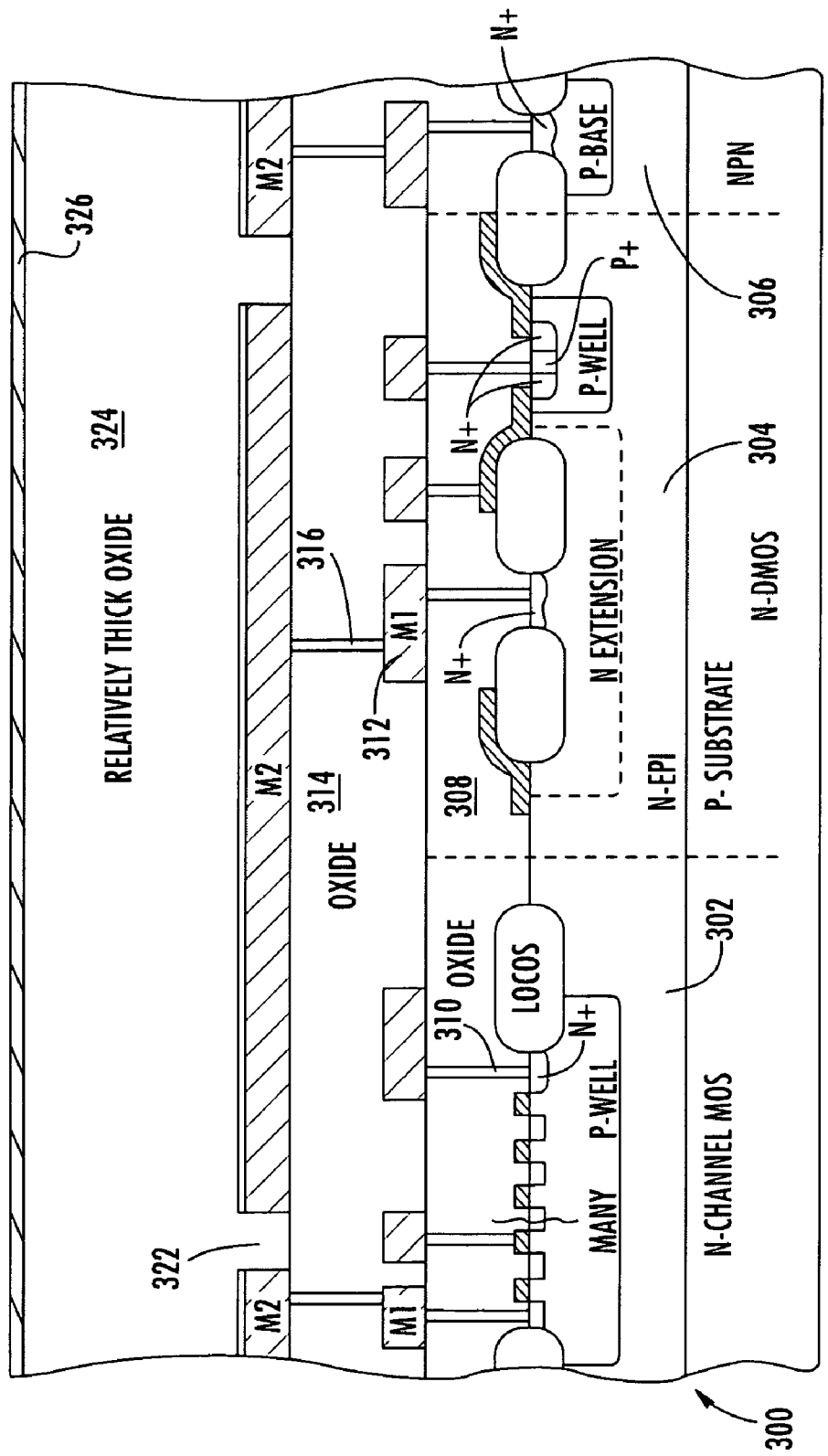
Figure 3F:
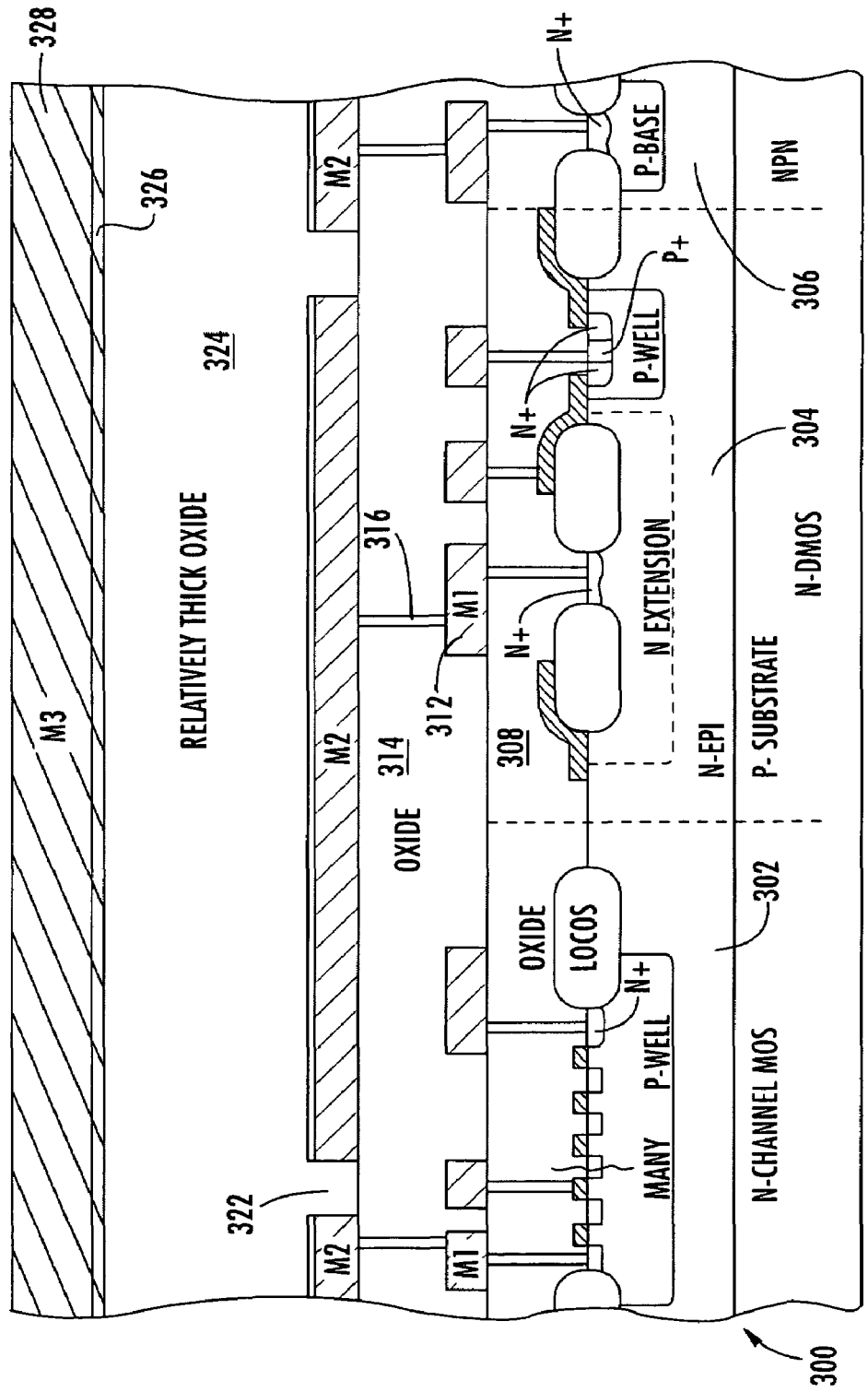
Figure 3G:
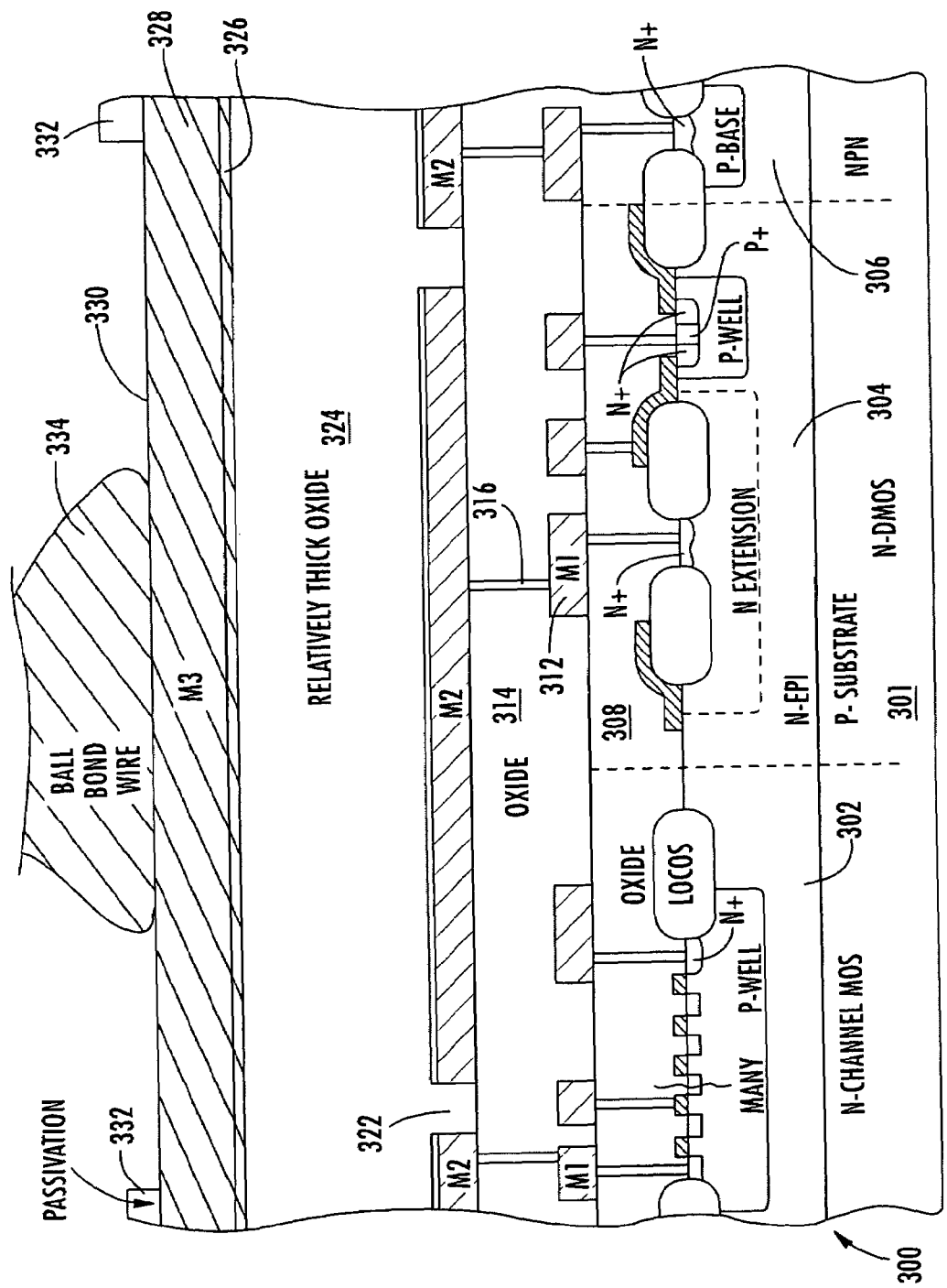

A layer of relatively stiff and hard metal layer 326 is then formed on the surface of the separating oxide layer 324. This is illustrated in FIG. 3E. This hard layer 326 distributes both lateral and vertical stress is over a larger area of the separating oxide layer 324. Some embodiments of the hard layer 326 are formed by a layer of nitride such as TiN or SiN. In yet another embodiment the hard layer 326 is formed by a layer of TiW. Moreover, in one embodiment, the hard layer 326 is formed to be approximately 80 nm in thickness. Referring to FIG. 3F the third metal layer M3 328 is formed overlaying hard layer 326. In one embodiment, the hard layer 326 is a sub layer formed during the formation of the third metal layer M3 328 by conventional sub-micron deposition and etch techniques. In still another embodiment (not shown), the hard layer 326 is a sub layer of the third metal layer M3 328 formed near the separating oxide layer 324. A bond pad 330 is then formed on an upper surface of the third metal layer M3 328 by patterning a deposited passivation layer 332. This is illustrated in FIG. 3G. Further as illustrated in FIG. 3G, a ball bond wire 334 is then coupled to the bond pad 330. Although, not shown in the Figures, vias are formed in the relatively thick oxide 324 so that the top metal layer 328 can also be used to interconnect devices. Moreover, it will be understood in the art that a single integrated circuit may have multiple bond pads and the present invention is not limited to a single bond pad.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

The invention claimed is:

1. An integrated circuit comprising:
   a substrate;
   a top conductive layer, the top conductive layer having at least one bonding pad and a sub-layer of relatively stiff material, wherein the sub-layer of relatively stiff material is relatively stiff compared to a remainder of the top conductive layer;
   one or more intermediate conductive layers formed between the top conductive layer and the substrate;
   layers of insulating material separating the top conductive layer from the one or more intermediate conductive layers and separating layers of the more intermediate conductive layers, one layer of the layers of insulating material is relatively thick compared to the other layers of insulating material and is located between the top conductive layer and an intermediate conductive layer closest to the top conductive layer; and devices formed in the integrated circuit, wherein at least the intermediate conductive layer closest to the top conductive layer is adapted for functional interconnections of select devices under the bonding pad.

2. The integrated circuit of claim 1, wherein the sub-layer is made of TiN.

3. The integrated circuit of claim 1, wherein the sub-layer is made of TiW.

4. The integrated circuit of claim 1, where the sub-layer is a layer of nitride.

5. The integrated circuit of claim 1, wherein the one or more intermediate conductive layers are formed into interconnect lines to accommodate currents.

6. The integrated circuit of claim 1, wherein at least one of the top conductive layer and the intermediate conductive layers further comprises:
conductive sub-layers formed by a sub-micron process.

7. The integrated circuit of claim 1, wherein at least one of the top conductive layer and the intermediate conductive layers are a metal layer.

8. The integrated circuit of claim 7, wherein at least one of the metal layers are formed from a metal layer from a group of metal layers comprising aluminum and copper.

9. The integrated circuit of claim 1, wherein the one or more intermediate conductive layers further comprises:
a second conductive layer, the second conductive layer separated from the top conductive layer by the relatively thick insulating layer.

10. The integrated circuit of claim 9, wherein the relatively thick insulating layer is an oxide layer that is at least 1.5 μm thick.

11. The integrated circuit of claim 9, wherein the second conductive layer further comprises:
a layer of TiN positioned adjacent the relatively thick insulating layer.

12. The integrated circuit of claim 9, wherein the second conductive layer has gaps.

13. The integrated circuit of claim 12 wherein the gaps take up no more than 10% of the total area of the second conductive layer under the at least one bonding pad.

14. The integrated circuit of claim 12, wherein the gaps are orientated to minimize the impact on current flow through the second conductive layer.

15. An integrated circuit comprising:
a substrate;
device regions formed on and in the substrate;
a top metal layer, the top metal layer having one or more bonding pads formed thereon, the device regions located between the substrate and the one or more bonding pads of the top metal layer;
a second metal layer located between the top metal layer and the device regions; and
a layer of insulating material separating the top metal layer from the second metal layer, wherein the insulating layer has a thickness adapted to resist cracking.

16. The integrated circuit of claim 15, wherein the relatively thick insulating layer is a layer of oxide having a thickness of at least 1.5 μm.

17. The integrated circuit of claim 15, further including:
one or more intermediate metal layers located between the device regions and the second metal layer.

18. The integrated circuit of claim 15, wherein the second metal layer includes a sub-layer of TiN located adjacent the layer of relatively thick insulating material.

19. The integrated circuit of claim 15, wherein the second metal layer has gaps adapted to strengthen the integrated circuit.

20. The integrated circuit of claim 19, wherein the gaps take up no more than 10% of the total area of the second metal layer under the one or more bonding pads.

21. The integrated circuit of claim 19, wherein the gaps are orientated to minimize the impact on current flow through the second metal layer.

22. The integrated circuit of claim 15, further comprising:
a layer of relatively stiff material adapted to distribute both lateral and vertical stresses over a larger area of the relatively thick insulating layer.

23. The integrated circuit of claim 22, wherein the layer of relatively stiff material is formed adjacent the top metal layer and the relatively thick insulating layer.

24. The integrated circuit of claim 22, wherein the layer of relatively stiff material is made of TiN.

25. The integrated circuit of claim 22, wherein the layer of relatively stiff material is made of TiW.

26. The integrated circuit of claim 22, wherein the thickness of the relatively stiff material is approximately 80 nm.

27. The integrated circuit of claim 22, wherein the layer of relatively stiff material is a layer of nitride.

28. The integrated circuit of claim 22, wherein the layer of relatively stiff material is a sub-layer of the top metal layer formed by a sub-micron process.

29. The integrated circuit of claim 28, wherein the sub-layer of relatively stiff material is formed near the relatively thick insulating layer.

30. An integrated circuit comprising:
a substrate;
a plurality of devices formed on and in the substrate;
a top metal layer having at least one bond pad formed on a surface of the top metal layer;
a second metal layer located between the at least one bond pad and the substrate, the second metal layer having gaps adapted to strengthen the integrated circuit; and
a first layer of insulating material formed between the at least one bond pad and the second metal layer.

31. The integrated circuit of claim 30, wherein the density of the gaps in the second metal layer is minimized to minimize the impact on the function of the integrated circuit.

32. The integrated circuit of claim 30, wherein the gaps take up no more than 10% of the total area of the second metal layer under an associated bond pad.

33. The integrated circuit of claim 30, wherein the gaps extend in a direction of a current flow.

34. The integrated circuit of claim 30, wherein the top metal layer includes a relatively stiff sub-layer located adjacent the first insulating layer, wherein the relatively stiff sub-layer is relatively stiff compared to a remainder of the top metal layer.

35. The integrated circuit of claim 30, wherein the second metal layer includes a TiN sub-layer located adjacent the first layer of insulating material.

36. The integrated circuit of claim 30, wherein the second metal layer includes a TiW sub-layer located adjacent the first layer of insulating material.

37. The integrated circuit of claim 30, wherein the first layer of insulating material is relatively thick compared to other layers of insulating material used to form the integrated circuit.

38. The integrated circuit of claim 37, wherein the first layer of insulating material is a first oxide layer having a thickness of at least 1.5 μm.

39. The integrated circuit of claim 14, wherein the gaps being orientated to minimize the impact on the current flow through the second metal layer, further comprises:
extending the gaps in the direction of the current flow.

40. The integrated circuit of claim 21, wherein the gaps being orientated to minimize the impact on the current flow through the second metal layer, further comprises:
extending the gaps in the direction of the current flow.

41. An integrated circuit comprising:
a substrate;
a top conductive layer, the top conductive layer having at least one bonding pad and at least one sub-layer wherein the at least one sub-layer is relatively more stiff than the other sub-layers of the top conductive layer;
one or more intermediate conductive layers formed between the top conductive layer and the substrate;
one or more layers of insulating material separating the one or more intermediate conductive layers and the top conductive layer from each other; and
devices formed in the integrated circuit, wherein at least the intermediate conductive layer closest to the top conductive layer is adapted for functional interconnections of select devices under the bond pad.

42. The integrated circuit of claim 41, wherein the at least one sub-layer is one from a group comprising TiN, SiN and TiW.

43. The integrated circuit of claim 41, wherein at least one of the intermediate conductive layers has gaps.

44. The integrated circuit of claim 43, wherein the gaps extend in a direction of current flow to minimize their impact on current flow.

45. The integrated circuit of claim 41, wherein the at least one of the intermediate conductive layers is the intermediate conductive layer closest the top conductive layer.

46. The integrated circuit of claim 41, wherein one layer of the layers of insulating material is thicker than the other layers of insulating material and is located between the top conductive layer and an intermediate conductive layer closest to the top conductive layer.

47. An integrated circuit comprising:
a substrate;
device regions formed on and in the substrate;
a top metal layer, the top metal layer having one or more bonding pads formed thereon, at least one device region located between the substrate and the one or more bonding pads a second metal;
layer located between the top metal layer and the device regions; and
a first layer of insulating material separating the top metal layer from the second metal layer, wherein the first layer of insulating material has a thickness selected to resist cracking.

48. The integrated circuit of claim 47, wherein the layer of insulating material is at least 1.5 µm thick.

49. The integrated circuit of claim 47 wherein the second metal layer has one or more gaps extending in the direction of current flow.

50. The integrated circuit of claim 47, further comprising:
a plurality of intermediate metal layers between the top metal layer and the substrate, the plurality of intermediate metal layers including the second metal layer; and
layers of insulating material separating the intermediate metal layers from each other, the layers of insulating material including the first layer of insulating material.

51. The integrated circuit of claim 50, wherein the plurality of intermediate metal layers under the one or more bonding pads are adapted for active devices and functional interconnections.

52. An integrate circuit comprising:
a substrate;
a top conductive layer, the top conductive layer having at least one bonding pad formed thereon;
one or more intermediate conductive layers formed between the top conductive layer and the substrate;
one or more layers of insulating material separating the one or more conductive layers from each other;
one of the one or more intermediate conductive layers closest the top conductive layer having gaps adapted to strengthen the integrated circuit; and
devices formed in the integrated circuit, wherein the one or more intermediate conductive layers are adapted for functional interconnections of select devices under the bonding pad.

53. The integrated circuit of claim 52, further comprising:
a sub-layer of relatively stiff material that is stiffer than the top conductive layer, the sub-layer of relatively stiff material formed between the top conductive layer and one of the one or more layers of insulating material separating the at least one intermediate conductive layer closest to the top conductive layer.

54. The integrated circuit of claim 52, wherein one layer of the layers of insulating material is thicker than the other layers of insulating material and is located between the top conductive layer and an intermediate conductive layer closest to the top conductive layer.

55. The integrated circuit of claim 52, wherein the gaps in the one of the one or more intermediate conductive layers closest the top conductive layer extend in a direction of current flow to minimize their impact on current flow.

56. The integrated circuit of claim 52, wherein the gaps in the one of the one or more intermediate conductive layers closest the top conductive layer take up no more than 10% of the area under the at least one bonding pad.

57. An integrated circuit comprising:
a substrate;
a top conductive layer, the top conductive layer having at least one bonding pad formed thereon and at least one sub-layer wherein the at least one sub-layer is relatively more stiff than a remaining portion of the top conductive layer;
one or more intermediate conductive layers formed between the top conductive layer and the substrate, one of the one or more intermediate conductive layers closest the top conductive layer having gaps adapted to strengthen the integrated circuit;
one or more layers of insulating material separating the one or more intermediate conductive layers and the top conductive layer from each other, the one or more layers of insulating material including a first layer of insulating material separating the top conductive layer from the closest one of the one or more intermediate conductive layers, wherein one of the one or more layers of insulating material has a thickness selected to resist cracking; and
devices formed in the integrated circuit, wherein the one or more intermediate conductive layers under the at least one bonding pad are adapted for active devices and functional interconnections.

* * * * *